(12) United States Patent
Cavazza

(10) Patent No.: US 8,302,839 B2
(45) Date of Patent: Nov. 6, 2012

(54) DEVICE FOR ASSEMBLING COMPONENTS HAVING METAL BONDING PADS

(75) Inventor: Gilbert Cavazza, Viuz en Sallaz (FR)

(73) Assignee: S.E.T., St Jeoire (FR)

( * ) Notice: Subject to any disclaimer, the term of this patent is extended or adjusted under 35 U.S.C. 154(b) by 301 days.

(21) Appl. No.: 12/486,423

(22) Filed: Jun. 17, 2009

(65) Prior Publication Data

US 2009/0313816 A1 Dec. 24, 2009

(30) Foreign Application Priority Data

Jun. 18, 2008 (FR) ..................... 08 03397

(51) Int. Cl.
*B23K 1/00* (2006.01)
(52) U.S. Cl. ........................... 228/42; 228/44.7; 29/739

(58) Field of Classification Search .................... 228/42, 228/44.7; 29/739

See application file for complete search history.

(56) References Cited

U.S. PATENT DOCUMENTS

| 6,464,795 B1 * | 10/2002 | Sherstinsky et al. .......... 118/728 |
| 2005/0133574 A1 | 6/2005 | Glever et al. |
| 2009/0020593 A1 | 1/2009 | Kinoshita et al. |

* cited by examiner

*Primary Examiner* — Nicholas D'Aniello
(74) *Attorney, Agent, or Firm* — Greer, Burns & Crain, Ltd.

(57) ABSTRACT

A device for assembling components having metal bonding pads includes plates that can move relative to each other, bearing metal components respectively and leaving between them a flat chamber surrounding the components when the latter are in contact with each other. The flat chambers can be saturated with deoxidizing gaseous fluid.

8 Claims, 3 Drawing Sheets

DEVICE FOR ASSEMBLING COMPONENTS HAVING METAL BONDING PADS

BACKGROUND OF THE INVENTION

The present invention relates to ceramic metal composites and to processes for the production thereof. More particularly, but not exclusively, it relates to metal-ceramic composites of biocompatible metals and bioactive ceramics.

DESCRIPTION OF THE PRIOR ART

It is known that, in order to assemble components by bonding their metal pads, it is essential for the metal contact surfaces of said pads to be oxidation-free.

Now, such contact surfaces naturally oxidize on contact with oxygen from the ambient air and consequently are already oxidized before bonding. They also undergo substantial oxidation while the components are being heated during bonding, which impairs the quality of this bonding.

The object of the present invention is to remedy these drawbacks.

BRIEF DESCRIPTION OF THE INVENTION

For this purpose, according to the invention, the device for assembling components having metal bonding pads, especially microelectronic components, said device comprising a first plate and a second plate facing each other and capable of being moved relative and parallel to each other so as to be able to bring said first and second plates closer together and further apart, said first and second plates bearing at least one such first component and at least one such second component respectively and comprising heating means for heating said first and second components respectively, said components facing each other and their respective metal pads being able to be brought into contact with each other by bringing said first and second plates together, is noteworthy in that:

said first plate has a first outer zone surrounding said first component and provided with at least:
  a first orifice radially close to said first component and capable of being supplied with a deoxidizing gaseous fluid,
  a second orifice radially far from said first component and capable of being supplied with an inert gaseous fluid, and
  a third orifice placed radially between said first orifice and said second orifice and capable of being connected to suction means;
said second plate has a second outer zone surrounding said second component and is capable of covering at least all of said first plate; and
when said first and second components are in contact with each other, said first and second plates leave between them a flat chamber surrounding said first and second components.

Thus, when the components are in contact with each other, the first orifice may inject a deoxidizing gas mixture, for example an acid/nitrogen-based mixture, into the flat chamber so as to saturate the space surrounding the components, thereby making it possible, on the one hand, to deoxidize said metal contact surfaces and, on the other hand, to preserve them from any oxidation by oxygen from the air. Furthermore, the second orifice may inject an inert gas, for example nitrogen, into the peripheral space of the flat chamber so as to form an obstacle to ingress of air into said flat chamber. In this way, by maintaining within the flat chamber an oxygen-free gaseous environment, oxidation of said metal contact surfaces is prevented. Finally, the deoxidizing gas mixture and the inert gas that are thus injected into the flat chamber may be sucked out via the third orifice, inserted between the first and second orifices. Thus, the gas mixture in the flat chamber is replenished, thereby guaranteeing that there is no oxygen in said chamber. Sucking the deoxidizing gas mixture also prevents said mixture from escaping from the flat chamber, thus enabling the assembly device to be used without any risk to the health of the operators.

For this purpose, it is advantageous for the flowrate of said gas sucked in via said third orifice to be less than the sum of the flowrates of the gases introduced into said flat chamber. Thus, the pressure of the gaseous fluid in the flat chamber, injected via the first and second orifices, is at least slightly above the atmospheric pressure of the air, thereby preventing any ingress of air via the perimeter of the flat chamber.

Advantageously, each of said first, second and third orifices takes the form of a ring surrounding said first component and said rings are concentric.

Thus, the gaseous fluids are injected into the flat chamber uniformly and sucked out therefrom very effectively.

To further improve the nonoxidizing quality of the gaseous environment between said plates, said first plate may also include a fourth orifice capable of injecting an inert gas with a low flowrate, making it possible to saturate a zone surrounding said first component with inert gas and possibly capable of retaining oxygen.

Preferably, said second plate bears on the perimeter of said second outer zone means capable of at least partially sealing the perimeter of said flat chamber when said first and second components are in contact with each other.

Thus, the sealing means create an additional barrier that forms an obstacle to the air surrounding the assembly device of the invention. Furthermore, owing to the perimeter of the flat chamber being at least partially sealed, the pressure rises substantially in the latter, thus preventing ingress of oxygen from the air into the flat chamber.

Said sealing means may be formed by a rigid ring captive with said second plate, whilst still being free to slide, in a limited manner, parallel to the relative displacement of said first and second plates and said rigid ring is advantageously mounted freely on the rods of actuators capable of retracting said ring into said second plate.

The figures of the appended drawings will make it clearly understood how the invention can be realized. In these figures, identical references denote similar elements.

DESCRIPTION OF THE PREFERRED EMBODIMENTS

Figure 1:
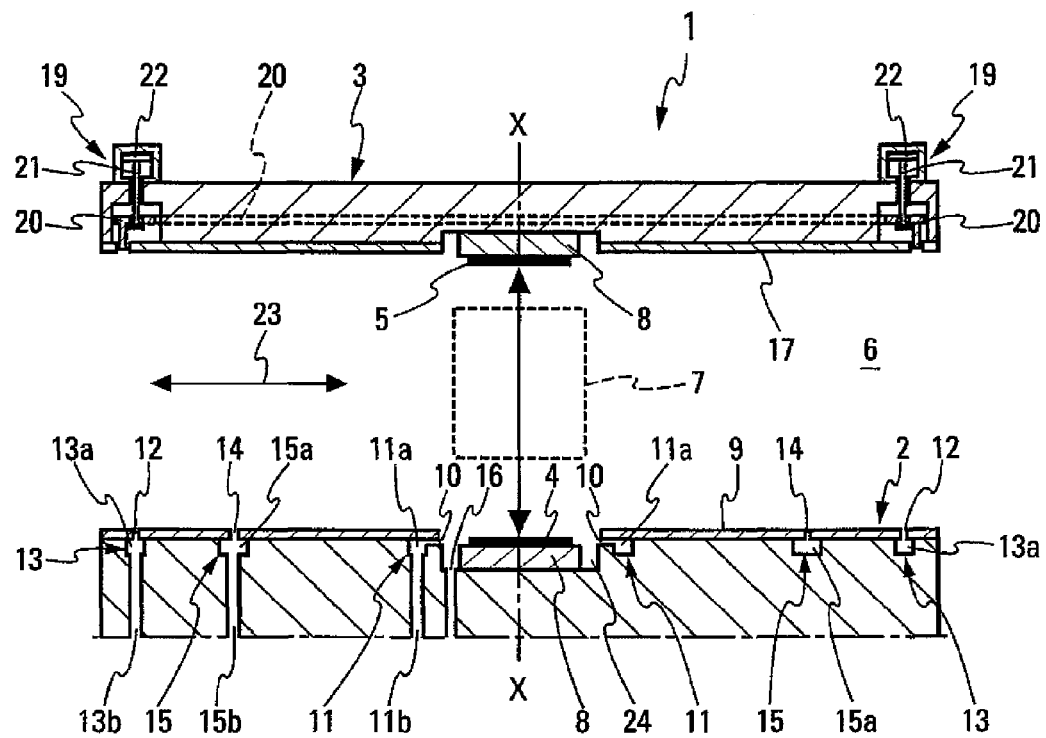
FIG. 1 is a schematic view, in cross section, of the assembly device in one embodiment according to the present invention, when the first and second plates of the device are away from each other.
Figure 3:
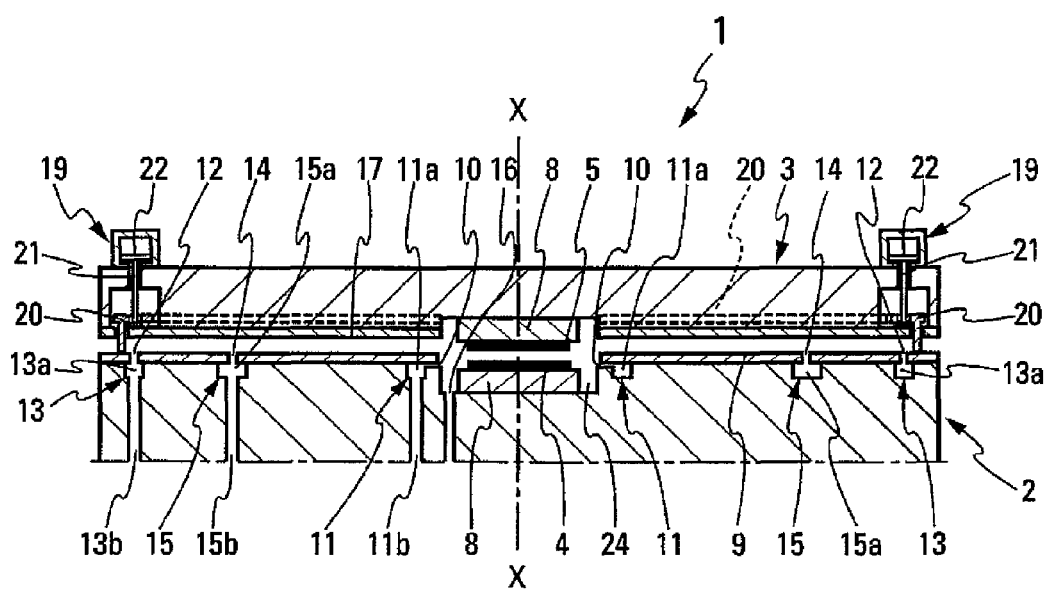
FIG. 3 shows, in a view similar to FIG. 1, the device of the invention when the rigid ring of the sealing means is in contact with the first plate, the first and second components themselves being spaced from each other.
Figure 2:
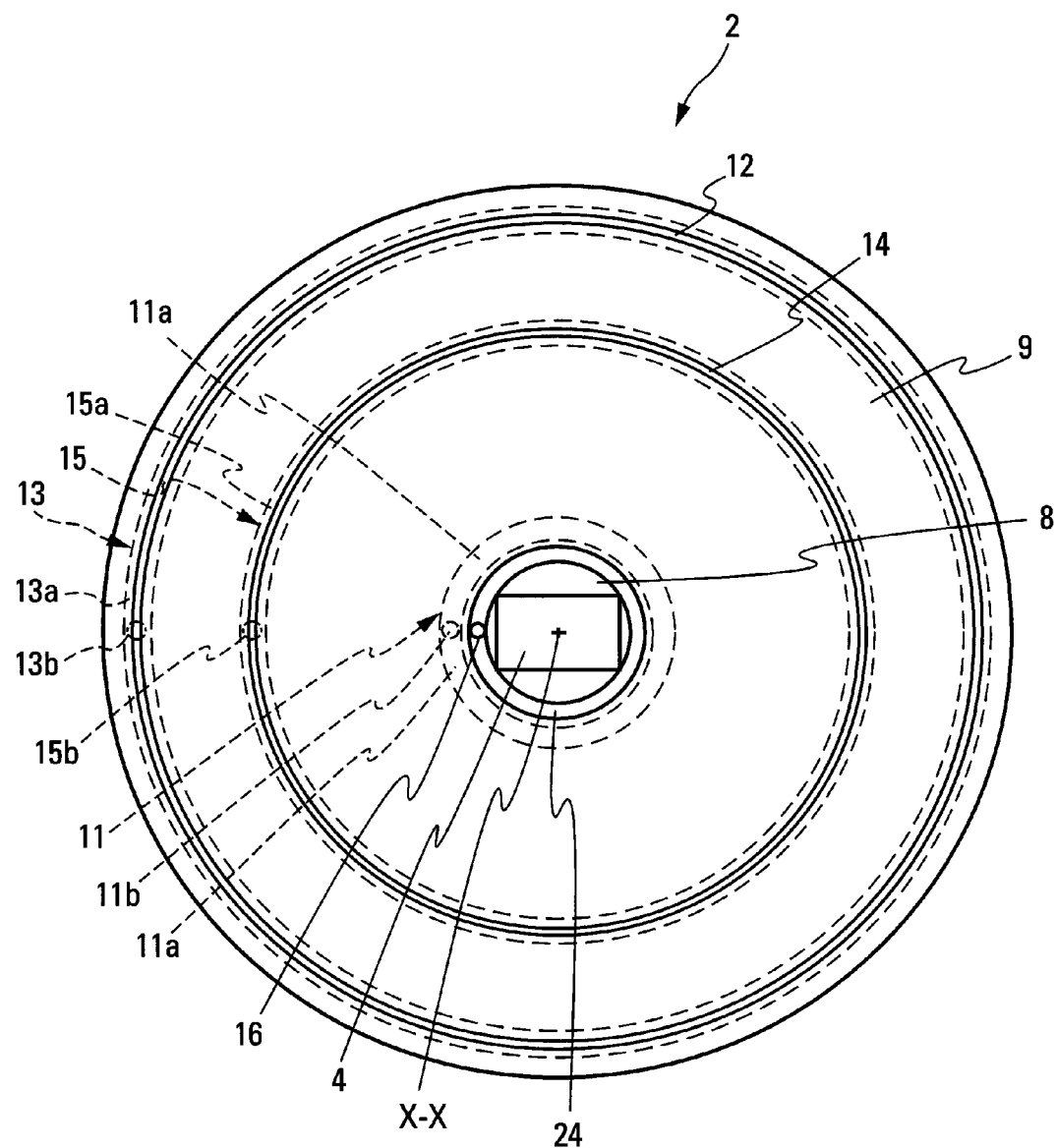
FIG. 2 shows, in a schematic top view along the arrow 11 of FIG. 1, the first plate of the device of the invention.
Figure 4:
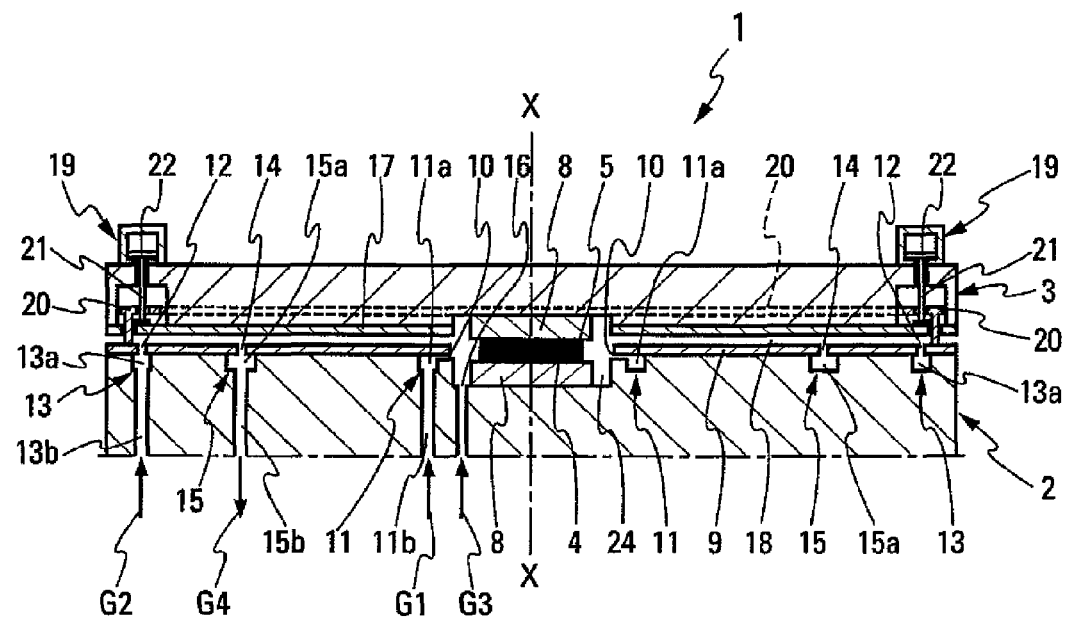
FIG. 4 is similar to FIG. 3, where the first and second components are in contact with each other.

The device 1 for assembling the components having metal bonding pads, shown in FIGS. 1, 3 and 4, comprises a first plate 2 and a second plate 3 facing each other, for example of circular shape, which bear first 4 and second 5 components having metal bonding pads respectively. In these figures, said metal bonding pads have not been shown.

The two plates 2 and 3 are capable of moving relative and parallel to each other along the axis X-X, so as to be able to occupy one of the following two positions:

a separated position (FIG. 1) in which the first 2 and second 3 plates are away from each other. In this position, a microscope 7 may be inserted, into the internal space 6 formed between the two plates 2 and 3, so as to precisely align the first 4 and second 5 components. Such an alignment may for example be carried out by moving the second plate 3 along two orthogonal directions (one of which is shown symbolically by the arrow 23) forming a plane parallel to the first plate 2; and a bonding position (FIG. 4) in which the metal pads of the first 4 and second 5 components are brought into contact with each other, ready to be bonded.

Furthermore, each plate 2 and 3 includes heating means placed beneath the component to be assembled. These heating means consist of a heating plate 8 on which the component rests.

According to the present invention, as shown in FIGS. 1 to 4, the first plate 2 also includes a first outer zone 9 which surrounds the first component 4.

The first outer zone 9 comprises:

a first orifice 10, radially close to the first component 4. The first orifice 10 can be supplied with a deoxidizing gas (shown symbolically by the arrow G1 in FIG. 4), by means of first supply means 11, when the first 2 and second 3 plates occupy the bonding position (FIG. 4). The first orifice 10 runs into an annular space 24 surrounding the heating plate 8 bearing the first component 4;

a second orifice 12, radially away from the first component 4. The second orifice 12 can be supplied with an inert gas (shown symbolically by the arrow G2 in FIG. 4), by means of second supply means 13, when the two plates 2 and 3 are in the bonding position. The second orifice runs into the surface of the first outer zone 9 of the first plate 2;

a third orifice 14, on the surface of the first outer zone 9, placed radially between the first orifice 10 and the second orifice 12 and connected to suction means 15; and a fourth orifice 16, inserted between the first orifice 10 and the heating plate 8 supporting the first component 4. The fourth orifice 16 is capable of injecting an inert gas with a low flowrate (shown symbolically by the arrow G3 in FIG. 4) capable of saturating said annular space 24 with inert gas.

The first, second and third orifices 10, 12 and 14 take the form of a ring surrounding the first component 4 and are concentric.

As shown in FIGS. 1 to 4, the first 11 and second 13 supply means are provided with a gas reservoir (11a and 13a respectively) of annular shape, housed in the first plate 2 and supplied with gas via a feed channel (11b and 13b respectively).

The orifice of flow from the reservoir of the first 11 and second 13 supply means corresponds to the first 10 and second 12 orifices respectively.

Moreover, the suction means 15 consist of an annular gas recovery zone 15a provided within the first plate 2 and connected to a discharge channel 15b.

According to the invention, the second plate 3 includes a second outer zone 17 surrounding the second component 5 and is capable of completely covering the first plate 2 in the bonding position (FIG. 4).

Advantageously, as shown in FIG. 4, in the bonding position, the first and second plates 2,3 leave between them a flat chamber 18, which surrounds the first 4 and second 5 components in contact via their respective metal pads.

According to the embodiment of the invention shown, the second plate 3 bears sealing means 19 capable of sealing the perimeter of said flat chamber 18 in the bonding position.

As shown in FIGS. 1, 3 and 4, the sealing means 19 are formed by a rigid ring 20 captive with the second plate 3 whilst still being free to slide, in a limited manner, parallel to the relative displacement of the two plates 2 and 3.

Figure 5:
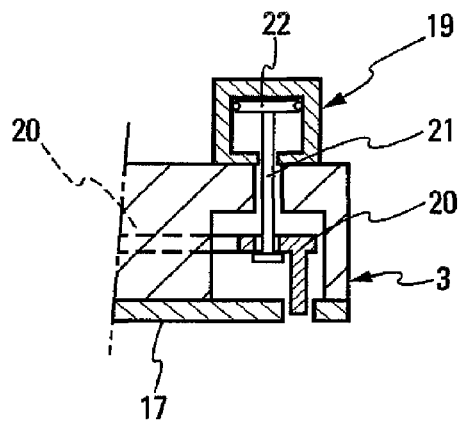
FIG. 5 is an enlarged schematic view of the sealing means of FIG. 1, when the two plates are spaced apart.
Figure 6:
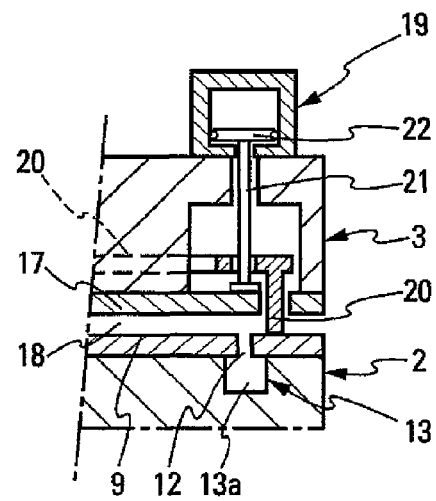
FIG. 6 is a figure similar to FIG. 5, where the first and second plates are together.

More precisely, as illustrated in FIGS. 5 and 6, the rigid ring 20 is mounted freely on the rods 21 of first and second actuators 22 placed in diametrically opposed positions on the peripheral upper part of the second plate 3. The actuators 22 are capable of retracting the rigid ring 20 into the second plate 3.

Thus, during the relative separating movement of the plates 2 and 3 from the bonding position to the separated position, the rod 21 of each of the two actuators 22 retracts, causing the rigid ring 20 to enter the second plate 3 (FIG. 1).

In contrast, during the relative closing movement of the two plates 2 and 3 in order to reach the bonding position, the rods 21 of the two actuators 22 deploy, causing the rigid ring 20 to leave, by gravity, the second plate 3.

As shown in FIGS. 3 and 4, upon contact with the first outer zone 9 of the first plate 2, the rigid ring 20 retracts slightly into the second plate 3 (FIG. 3) before the two plates 2 and 3 reach the bonding position (FIG. 4).

Once the bonding position has been reached, the rigid ring 20 at least partially seals the perimeter of the flat chamber 18 and the deoxidizing gas G1, the inert gas G2 and the inert saturating gas G3 can then be injected into the flat chamber 18 via the first 10, second 12 and fourth 16 orifices respectively.

The invention claimed is:

1. A components assembling device for assembling components having metal bonding pads, especially microelectronic components, said device comprising:

a first plate;

a second plate facing said first plate and being independently movable relative and parallel to said first plate via actuators so as to reciprocally move said first and second plates closer together and further apart, said first and second plates including at least one first component and at least one second component respectively, said first plate including a first heating plate and said second plate including a second heating plate for heating said first and second components respectively, said first and second components facing each other and their respective metal pads are brought into contact with each other when said first and second plates are moved together;

said first plate including a first outer zone surrounding said first component and provided with at least:

a first orifice radially close to said first component and configured to be supplied with a deoxidizing gaseous fluid, a second orifice radially far from said first component and configured to be supplied with an inert gaseous fluid, and
a third orifice placed radially between said first orifice and said second orifice and connected to suction means;
said second plate having a second outer zone surrounding said second component and being configured to cover said first plate; and
when said first and second components are in contact with each other, said first and second plates define a flat chamber therebetween that surrounds said first and second components.

2. The device as claimed in claim 1, wherein each of said first, second and third orifices is a ring surrounding said first component.

3. The device as claimed in claim 2, wherein said first, second and third orifices are concentric.

4. The device as claimed in claim 1, wherein said first plate includes a fourth orifice configured to inject an inert saturating gas with a low flowrate around said first component.

5. The device as claimed in claim 1, wherein the flowrate of said gas sucked in via third said orifice is less than the sum of the flowrates of the gases introduced into said flat chamber.

6. The device as claimed in claim 1, wherein said second plate includes, on the perimeter of said second outer zone, means capable of sealing the perimeter of said flat chamber when said first and second components are in contact with each other.

7. The device as claimed in claim 6, wherein said sealing means includes a rigid ring captive with said second plate, while still being free to slide, in a limited manner, parallel to said first and second plates.

8. The device as claimed in claim 7, wherein said sealing means includes opposing actuators and rods connected to said actuators, said rigid ring being mounted freely on the rods, wherein the actuators retract the rods, which retract said ring into said second plate.

* * * * *